US008138840B2

(12) United States Patent
Ainspan et al.

(10) Patent No.: US 8,138,840 B2
(45) Date of Patent: Mar. 20, 2012

(54) OPTIMAL DITHERING OF A DIGITALLY CONTROLLED OSCILLATOR WITH CLOCK DITHERING FOR GAIN AND BANDWIDTH CONTROL

(75) Inventors: Herschel A. Ainspan, New Hempstead, NY (US); John F. Bulzacchelli, Yonkers, NY (US); Zeynep Toprak Deniz, Glen Oaks, NY (US); Daniel J. Friedman, Sleepy Hollow, NY (US); Alexander V. Rylyakov, Mount Kisco, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 12/358,736

(22) Filed: Jan. 23, 2009

(65) Prior Publication Data
US 2010/0188158 A1 Jul. 29, 2010

(51) Int. Cl.
*H03L 7/085* (2006.01)
*H03L 7/089* (2006.01)

(52) U.S. Cl. .......... 331/1 A; 331/16; 331/34; 331/36 C; 375/376

(58) Field of Classification Search ............... 331/1 A, 331/16, 34, 36 C; 375/376
See application file for complete search history.

(56) References Cited

U.S. PATENT DOCUMENTS

| | | | |
|---|---|---|---|
| 4,034,196 A | 7/1977 | Butterweck et al. | |
| 5,036,294 A | 7/1991 | McCaslin | |
| 5,162,746 A | 11/1992 | Ghoshal | |
| 5,825,253 A | 10/1998 | Mathe et al. | |
| 5,900,755 A | 5/1999 | Toeppen et al. | |
| 6,414,555 B2 * | 7/2002 | Staszewski et al. | 331/18 |
| 6,594,330 B1 * | 7/2003 | Wilson | 375/376 |
| 6,714,084 B2 | 3/2004 | Smith | |
| 6,785,345 B2 | 8/2004 | Blazo | |
| 6,812,756 B2 | 11/2004 | Starr | |
| 6,917,317 B2 | 7/2005 | Nagaso et al. | |
| 6,952,534 B1 | 10/2005 | Sikora | |

(Continued)

FOREIGN PATENT DOCUMENTS

EP 1255355 A1 11/2002

(Continued)

OTHER PUBLICATIONS

Moon et al., Spectral Analysis of Time-Domain Phase Jitter Measurements; IEEE Transactions on Circuits and Systems- II: :Analog and Digital Signal Processing, vol. 49, No. 5; May 2002; pp. 321-327.

(Continued)

*Primary Examiner* — Arnold Kinkead
*Assistant Examiner* — Richard Tan
(74) *Attorney, Agent, or Firm* — Tutunjian & Bitetto, P.C.; Anne V. Dougherty, Esq.

(57) ABSTRACT

A digital phase locked loop (DPLL) and method include an adjustable delay line configured to receive a reference clock as an input and to output a dithered reference clock signal. A phase and frequency detector (PFD) is configured to compare the dithered reference clock signal with a feedback clock signal to determine phase and frequency differences between the dithered reference clock signal and the feedback clock signal. A digitally controlled oscillator (DCO) is configured to receive early or late determinations from the PFD to adjust an output in accordance therewith, wherein the dithered reference clock signal distributes jitter response to enhance overall operation of the DPLL.

23 Claims, 14 Drawing Sheets

U.S. PATENT DOCUMENTS

| | | | |
|---|---|---|---|
| 6,987,424 B1 | 1/2006 | Hein | |
| 7,046,098 B2 * | 5/2006 | Staszewski | 331/158 |
| 7,092,475 B1 * | 8/2006 | Huard | 375/375 |
| 7,127,022 B1 * | 10/2006 | Dieguez | 375/375 |
| 7,230,458 B2 | 6/2007 | DaDalt | |
| 7,312,663 B2 | 12/2007 | Abel | |
| 7,583,152 B2 * | 9/2009 | Zhang | 331/25 |
| 2002/0008557 A1 * | 1/2002 | Abdel-Maguid et al. | 327/159 |
| 2005/0036580 A1 * | 2/2005 | Rana | 375/376 |
| 2007/0096833 A1 | 5/2007 | Maurer et al. | |
| 2008/0068236 A1 * | 3/2008 | Sheba et al. | 341/118 |
| 2009/0072913 A1 * | 3/2009 | Eikenbroek | 331/18 |
| 2009/0096539 A1 * | 4/2009 | Chang et al. | 331/1 A |
| 2009/0302951 A1 * | 12/2009 | Ballantyne | 331/16 |

FOREIGN PATENT DOCUMENTS

| | | |
|---|---|---|
| EP | 1351397 A2 | 10/2003 |
| WO | WO03024005 A1 | 3/2003 |

OTHER PUBLICATIONS

Staszewski et al., A Digitally Controlled Oscillator in a 90 nm Digital CMOS Process for Mobile Phones; IEEE Journal of Solid-State Circuits; vol. 40, No. 11; Nov. 2005; pp. 2203-2211.

Goyal et al., Reducing Sampling Clock Jitter to Improve SNR Measurement of A/D Converters in Production Test; Proceedings of the Eleventh IEEE European Test Symposium (ETS '06); 2006; 6 pages.

Lee et al., Brief Papers—Analysis and Modeling of Bang-Bang Clock and Data Recovery Circuits; IEEE Journal of Solid-State Circuits, vol. 39, No. 9, Sep. 2004; pp. 1571-1580.

Dadalt et al., Theory and Implementation of Digital Bang-Bang Frequency Synthesizers for High Speed Serial Data Communications; Dept. of Electrical Engineering and Computer Data Systems—RWTH Aachen; Sep. 24, 2007; 191 pages.

* cited by examiner

OPTIMAL DITHERING OF A DIGITALLY CONTROLLED OSCILLATOR WITH CLOCK DITHERING FOR GAIN AND BANDWIDTH CONTROL

BACKGROUND

1. Technical Field

The present invention relates to digital phase locked loop circuits and more particularly to circuits and methods for controlling dither in digitally controlled oscillators.

2. Description of the Related Art

At the heart of digital phase locked loops (DPLLs) is a digitally controlled oscillator (DCO). There is a fundamental difference between a DCO and a conventional VCO (voltage-controlled oscillator), commonly used in analog PLLs. The VCO is controlled by an analog voltage signal and therefore has a continuous tuning range. The DCO is controlled by a digital signal with a finite bit resolution and therefore produces a discrete set of frequencies.

Referring to FIG. 1, a DCO 10 can be modeled as a VCO 12 with a quantizer 14 at a voltage control input. The resulting quantization noise of the DCO 10 degrades DPLL output jitter and phase noise. As shown in FIG. 1, $\Delta f$ is the minimum DCO frequency spacing. In a linear model, the DCO quantization noise contribution can be estimated using a conventional model of additive uniformly distributed white noise with a variance of $(\Delta f)^2/12$. The resulting contribution to phase noise (assuming that a loop filter is running at the reference frequency $f_{REF}$) is given by the following equation (1):

$$L(f_{offset}) = \frac{1}{12}\left(\frac{\Delta f}{f_{offset}}\right)^2 \frac{1}{f_{ref}} \qquad (1)$$

Here, $f_{offset}$ is the offset from the carrier frequency. For example, if the DCO runs at f=4 GHz with a minimum frequency step ($\Delta f$) of 10 MHz, in a DPLL using a 200 MHz reference clock, the resulting phase noise due to the DCO quantization is -74 dBc/Hz, at a 1 MHz offset. Note that in the time domain, the oscillation period step $\Delta T$ due to DCO quantization is given by $\Delta f/f^2$, or 0.6 ps in the example above.

These numbers are comparable to or above the free-running DCO noise (which arises due to thermal fluctuations). The typical noise performance of a free-running ring oscillator is in the range from -90 dBc/Hz to -80 dBc/Hz to -75 dBc/Hz (at 1 MHz from 4 GHz), resulting in a free-running period jitter range from 0.1 ps to 0.3 ps to 0.7 ps RMS. For comparison, if a coarser DCO is used, with a 40 MHz frequency step, for example, the quantization noise contribution becomes dominant, e.g., -62 dBc/Hz (at 1 MHz from 4 GHz).

A simple way to reduce the impact of the DCO quantization noise is to increase DCO resolution by reducing the minimum frequency step $\Delta f$ and correspondingly increasing the total number of frequency steps. This approach, however, is often impractical, as it typically results in an unacceptable increase of DCO area and/or power dissipation. Another standard approach to this problem is to dither the DCO between two adjacent frequencies, f and f+$\Delta f$, as shown in FIG. 2.

Referring to FIG. 2, a plot showing frequency versus time to demonstrate basic DCO dithering is depicted. The plot shows instantaneous frequency 20 and an effective frequency 22. Dithering effectively results in a much smaller DCO minimum frequency step. An ideal 8-bit dithering modulator promises to reduce $\Delta f$ by a factor of $2^8$=256. In the example above that would reduce the quantization noise by 48 dB. The effect of quantization noise due to dithering depends on the type of dithering modulator that is used. It is well known that uniform dithering is not very effective in achieving the desired goal of reducing the DCO noise. Eq. 1 can be employed to estimate the effect of uniform dithering as follows:

$$L(f_{offset}) = \frac{1}{12}\left(\frac{\Delta f}{f_{offset}}\right)^2 \frac{1}{f_{DITH}} \qquad (2)$$

Here $f_{DITH}$ is the dithering frequency. In conventional DPLLs, $f_{DITH}$ is usually ¼ or ⅛ of the carrier frequency. In the numerical example above, the only effect of uniform dithering with 4 GHz/4=1 GHz is due to spreading the quantization noise over a 5 times wider band than the $f_{REF}$=200 MHz. The quantization noise is then reduced by just 7 dB, regardless of the number of bits in the modulator.

Noise-shaped dithering is more attractive than uniform dithering, as it reduces in-band noise by pushing the quantization errors into higher frequencies, where they will be naturally attenuated by the DPLL transfer function. The noise contribution of the 1st order Delta-Sigma dithering modulator is given by the following equation:

$$\mathcal{L}(f_{OFFSET}) = \frac{1}{12}\left(\frac{\Delta f}{f_{OFFSET}}\right)^2 \frac{1}{f_{DITH}}\left(2\sin\left(\frac{\pi \Delta f}{f_{DITH}}\right)\right)^2. \qquad (3)$$

At a 1 MHz offset, using the numbers from our numerical example, we get a 44 dB reduction of phase noise, for 1 GHz dithering. It should be noted that Eq. 1 still applies to Delta-Sigma dithering due to the finite number n of bits in the modulator, with $\Delta f$ replaced by $\Delta f/2^n$.

The fundamental characteristic of all these approaches to DCO dithering is that they treat the DCO as a standard quantizer and directly apply dithering techniques well-known in the digital to analog conversion/analog to digital conversion (DAC/ADC) literature. As a result, they all produce a finite amount of quantization noise. It should be noted that phase noise contributions given by Eqs. 1-3 all lead to a corresponding increase in DCO jitter.

Wireline communication applications typically require a low phase noise, wide timing range phase locked loop (PLL). While these requirements can be met using traditional charge pump PLL architectures, a high performance digital PLL (DPLL) based solution offers potential advantages in area, testability, and flexibility. Nearly all high-performance DPLL architectures reported in the literature to date incorporate a time to digital converter (TDC) that acts as the loop's phase and frequency detector (PFD). Subject to its quantization limits, a high-resolution TDC generates output signals proportional to the phase error at its input, effectively linearizing the PFD response. It should be noted, however, that reported high performance TDC-based DPLLs have generally been fractional-N, not integer-N synthesizers.

In a fractional-N loop, the phase difference between a feedback clock and a reference clock at the PFD input varies significantly, frequently jumping by as much as a full output clock period from one phase comparison to the next. At 10 GHz output, this results in a 100 ps phase shift, thus making a TDC with resolution on the order of 10- to 20 ps adequate to generate multiple quantization levels. In an integer-N case, by contrast, a PLL with 500 fs rms jitter at the output and a typical feedback divider value in the range of 16 to 40 would have feedback phase jitter of only 2 to 3.2 ps rms.

In this low noise situation, a TDC with less than 3.2 ps of resolution would act essentially like a bang-bang PFD (BB-PFD). Existing wireline communication PLLs are predominantly integer-N designs with strict system-level requirements on the rms jitter. A DPLL designer targeting these applications, therefore, would have to face the challenging and ever-increasing requirements on TDC resolution, or to find a way of using a BB-PFD.

The effective gain of a BB-PFD is a function of the jitter on its input signals, with gain increasing as jitter decreases. For PLLs that use BB-PFDs, therefore, the overall transfer function of the PLL is strongly influenced by elements not within the PLL design itself (such as the noise levels on the reference clock input). This is highly undesirable for applications such as serial link I/O clocking that demand low synthesizer noise as measured over defined integration bandwidths. One way that this can be resolved is by abandoning the bang-bang PFD approach and pursuing a time-to-digital (TDC)-based architecture, but this approach has numerous drawbacks in terms of complexity, area, power, calibration requirements, and compatibility with integer-N frequency synthesis specifications typical to wireline applications.

SUMMARY

In accordance with the present principles, an architecture and implementation for linearizing the response of a bang-band PFD is provided. A digital phase locked loop (DPLL) and method include an adjustable delay line configured to receive at least one of a reference clock and a feedback clock as an input and to output a dithered signal. A phase and frequency detector (PFD) is configured to compare clock signals including a reference clock signal and a feedback clock signal wherein at least one of the clock signals is the dithered signal to determine phase and frequency differences between the clock signals. A digitally controlled oscillator (DCO) is configured to receive early or late determinations from the PFD to adjust an output in accordance therewith, wherein the dithered signal distributes jitter response to enhance overall operation of the DPLL.

In one embodiment, the DPLL includes a dithering control circuit for changing an operating frequency to the DCO. The dithering control circuit includes a feedback loop connected to an output to feed back a control sequence to enable a frequency of operation, wherein the DCO is thereby dithered at a rate equal to or exceeding its operating frequency and a spectral density of an oscillator frequency distribution is shaped so that dithering energy falls at or near zero so that no additional jitter or phase noise is introduced by the dithering.

A method for controlling jitter in a digital phase locked loop (DPLL) includes adjusting delay in a delay line configured to receive at least one of a reference clock signal and a feedback clock signal as an input and to output a dithered signal; comparing the reference clock signal with the feedback clock signal, wherein at least one of the reference clock signal and the feedback clock signal is dithered, by using a phase and frequency detector (PFD) configured to determine phase and frequency differences; and adjusting an output of a digitally controlled oscillator (DCO) in accordance with early or late determinations from the PFD, wherein the dithered signal distributes jitter response to enhance overall operation of the DPLL.

Another apparatus and method for optimizing dither in a digitally controlled oscillator (DCO) includes dithering a DCO at a rate equal to or exceeding its operating frequency. A spectral density of an oscillator frequency distribution is actively shaped so that dithering energy falls at or near zero such that no additional jitter or phase noise is introduced in the dithering.

A self-dithered digitally controlled oscillator (DCO) circuit includes a DCO; and a dithering control circuit for changing an operating frequency to the DCO, the dithering control circuit including a feedback loop connected to an output to feed back a control sequence to enable a frequency of operation, wherein the DCO is thereby dithered at a rate equal to or exceeding its operating frequency and a spectral density of an oscillator frequency distribution is shaped so that dithering energy falls at or near zero so that no additional jitter or phase noise is introduced by the dithering.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
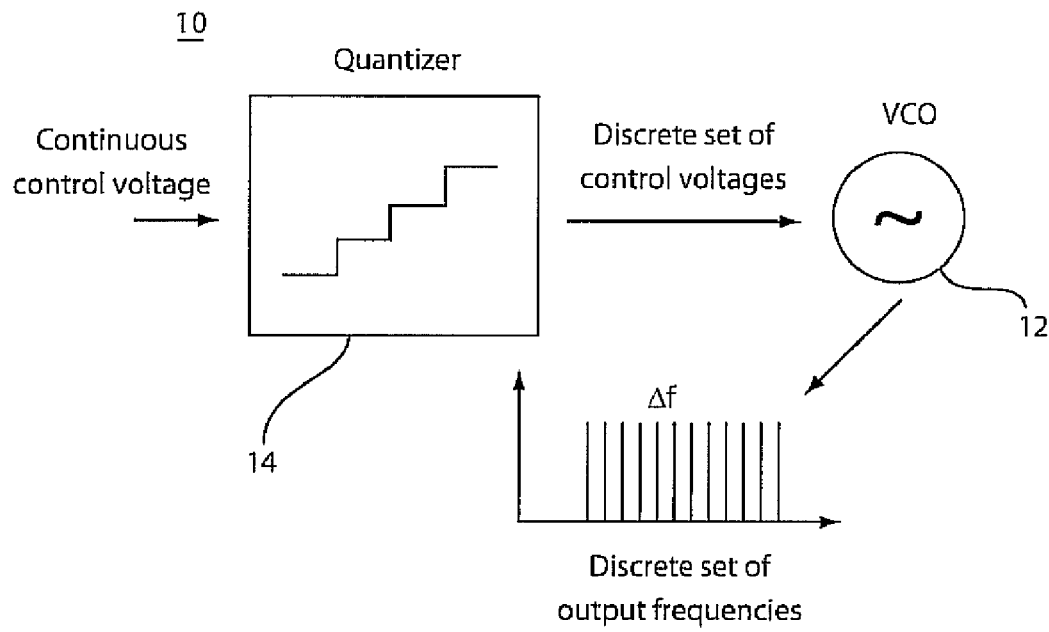
FIG. 1 is a digitally controlled oscillator (DCO) model shown in accordance with the prior art.
Figure 2:
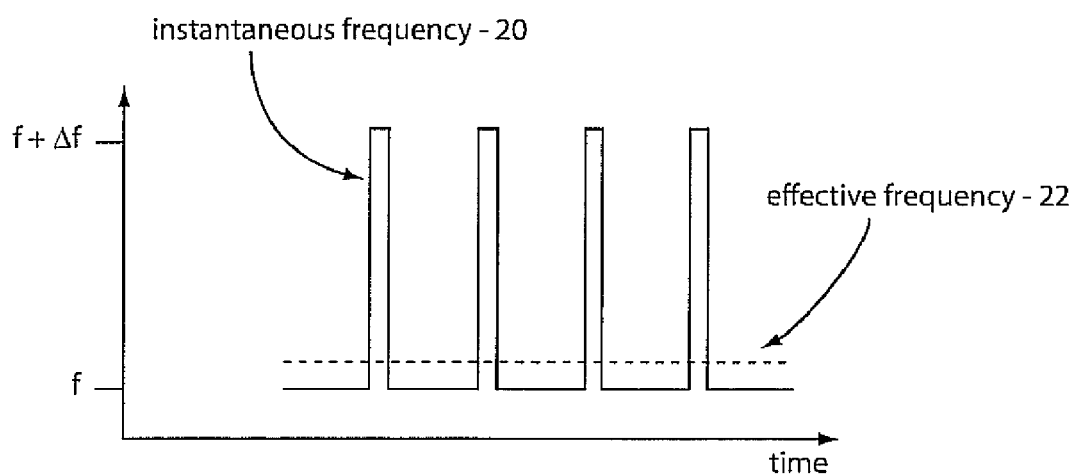
FIG. 2 is a plot showing basic DCO dithering in accordance with the prior art.

In accordance with the present principles, an architecture and implementation are provided for linearizing the response of a phase and frequency detector (PFD) and preferably a bang-bang PFD (BB-PFD). A BB-PFD transfer function is linearized by the use of a digitally controllable delay line to modulate the behavior of the reference clock input. This transfer function modification enables the gain of the BB-PFD to be controlled and known, with the noise power created by the modulation shaped to higher frequencies beyond the loop bandwidth of the PLL. A net effect of this is that jitter is injected into the PLL to make the behavior of the PLL more controllable and predictable, and, at the same time, improves the jitter performance of the PLL in frequency bands of interest, e.g., in wireline I/O applications.

An integer-N, BB-PFD digital phase locked loop (DPLL) architecture is provided, which may be useful in wireline communication. Such an architecture has been demonstrated by implementations targeting applications in the 8- to 11-Gb/s and 17- to 20-Gb/s ranges. The present embodiments achieve proportional path latency and gain needed for overall low noise DPLL performance. In typical BB-PFD based DPLL designs, the strong nonlinearity introduced by the BB-PFD manifests itself as a bounded limit cycle. This results in the DPLL output jitter increasing as proportional path latency and gain increase. To minimize the negative effect of the limit cycle, the present DPLL architecture features a separate, low latency proportional path, with the BB-PFD output directly controlling a digitally controlled oscillator (DCO). Other features include controllability of the proportional path gain and of the BB-PFD gain.

A dithering method that uses the fundamental properties of a digitally controlled oscillator is also provided. The method permits increasing a frequency resolution of the oscillator with no additional jitter or phase noise. The present embodiments permit dithering a Digitally Controlled Oscillator (DCO) at a much higher rate, equal to or exceeding its natural frequency. The DCO period is the same for all cycles, and no additional jitter is generated by this dithering scheme.

Dithering is an applied form of noise, used to randomize quantization error, thereby preventing the occurrence of large-scale patterns that may be more objectionable than uncorrelated noise. Dither is routinely used in processing of digital data. Dither may be applied to rate conversions and to bit-depth transitions. It is utilized in many different fields where digital processing and analysis are used, especially waveform analysis. These uses include systems employing digital signal processing, such as digital audio, digital video, digital photography, seismology, radar, weather forecasting systems, etc. Quantization and re-quantization of digital data yields error. If that error is repeating and correlated to the signal, the error that results is repeating, cyclical, and mathematically determinable. In some fields, especially where a receptor is sensitive to such artifacts, cyclical errors yield undesirable artifacts. In these fields, dither results in less determinable artifacts. The present principles actively shape the spectral density of the oscillator frequency distribution so that the dithering energy falls at or near the zeros in a spectral density integrand.

Embodiments of the present invention can take the form of an entirely hardware embodiment, an entirely software embodiment or an embodiment including both hardware and software elements. In a preferred embodiment, the present invention is implemented in hardware but may include software elements. The software elements may include but are not limited to firmware, resident software, microcode, etc.

The circuits as described herein may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 3A:
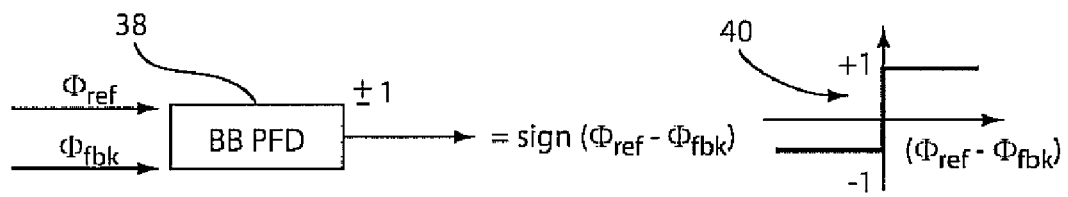
FIG. 3A shows a Bang-Bang Phase and Frequency Detector (BB-PFD) with a linearization is illustrated using a highly non-linear BB-PFD transfer function.
Figure 3B:
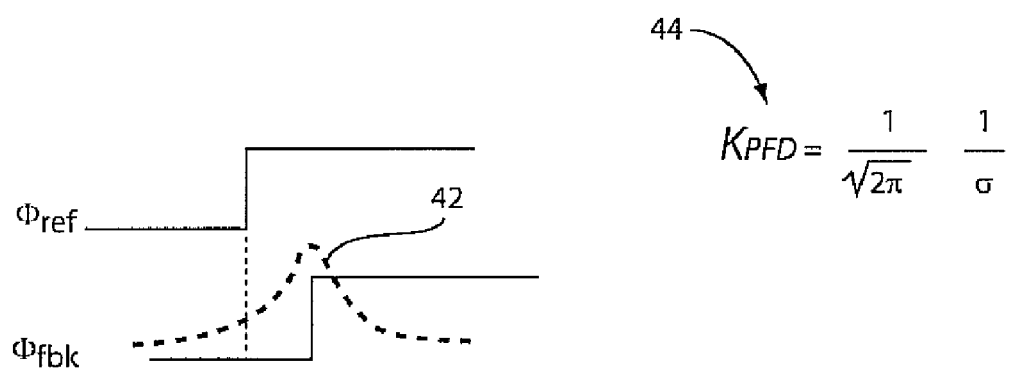
FIG. 3B shows a linearization of the BB-PFD transfer function and a resulting linear gain equation.
Figure 3C:
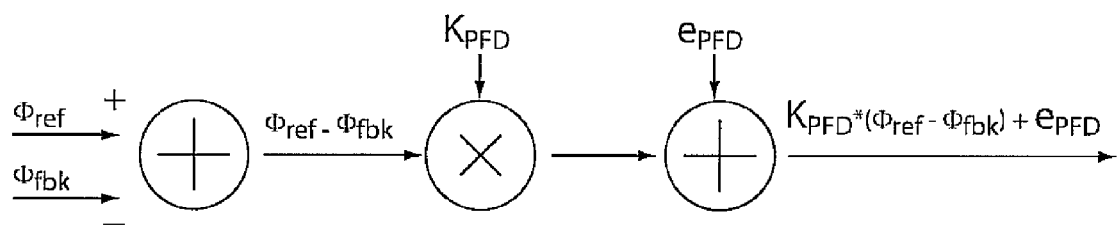
FIG. 3C is an equivalent linear representation of a BB-PFD, with quantization noise.
Figure 3D:
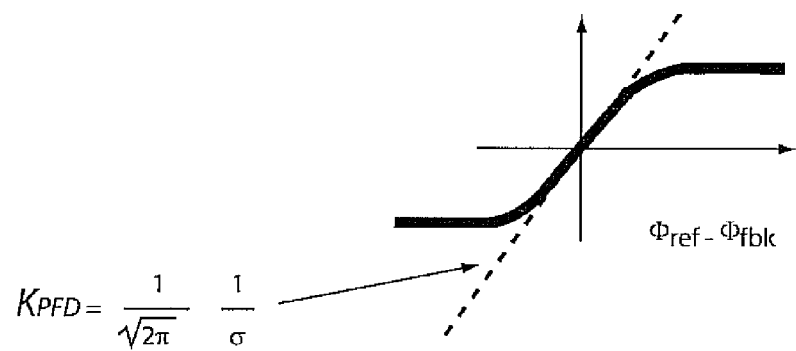
FIG. 3D is a plot showing a linearized transfer function.

Referring now to the drawings in which like numerals represent the same or similar elements and initially to FIGS. 3A-C, if it is assumed that the PLL is in a locked state, a BB-PFD 38 responds only to the phase difference between its inputs, and its frequency detection capability is not utilized. In a locked state, as depicted in FIG. 3A, reference ($\Phi$ref) and feedback ($\Phi$fbk) phases of the PLL closely track each other (i.e., no cycle-slipping occurs). The phase error $\Phi$ref−$\Phi$fbk can be assumed to be small (much less than $2\pi$). A transfer characteristic 40 of a bang-bang PFD under these conditions is shown in FIG. 3A. The BB-PFD output is simply "late" or "early" (+1 or −1), depending on the sign of $\Phi$ref−$\Phi$fbk. This nonlinear binary characteristic is smoothed by jitter that is always present in the reference and feedback signals, as shown in FIG. 3B. The average output of the PFD is then a smooth function 42, with values between −1 and +1. The resulting linear gain, $K_{PFD}$, of the PFD is given by equation 44 in FIG. 3B.

Here $\sigma$ is the standard deviation of the jitter at the PFD inputs, the root mean square (r.m.s.) of the phase error. Note that, in general, the PLL design targets lowering the output phase noise which, in turn, results in a lower phase error at the PFD input. At small $\sigma$, the PFD gain is typically too high and the resulting PLL bandwidth is much larger than required by many applications. The linear model of the PFD, complete with quantization phase noise ($e_{PFD}$), is shown in FIG. 3C. Another consequence of the equation 14 of FIG. 3B is that a has a component external to the PLL design, namely, the jitter of the reference clock. In this situation, one of the main PLL parameters cannot be controlled by the PLL designer. In FIG.

3D, a linearized transfer function is illustratively shown based on the Equation of FIG. 3B. The BB-PFD gain is inversely proportional to input jitter.

Figure 4:
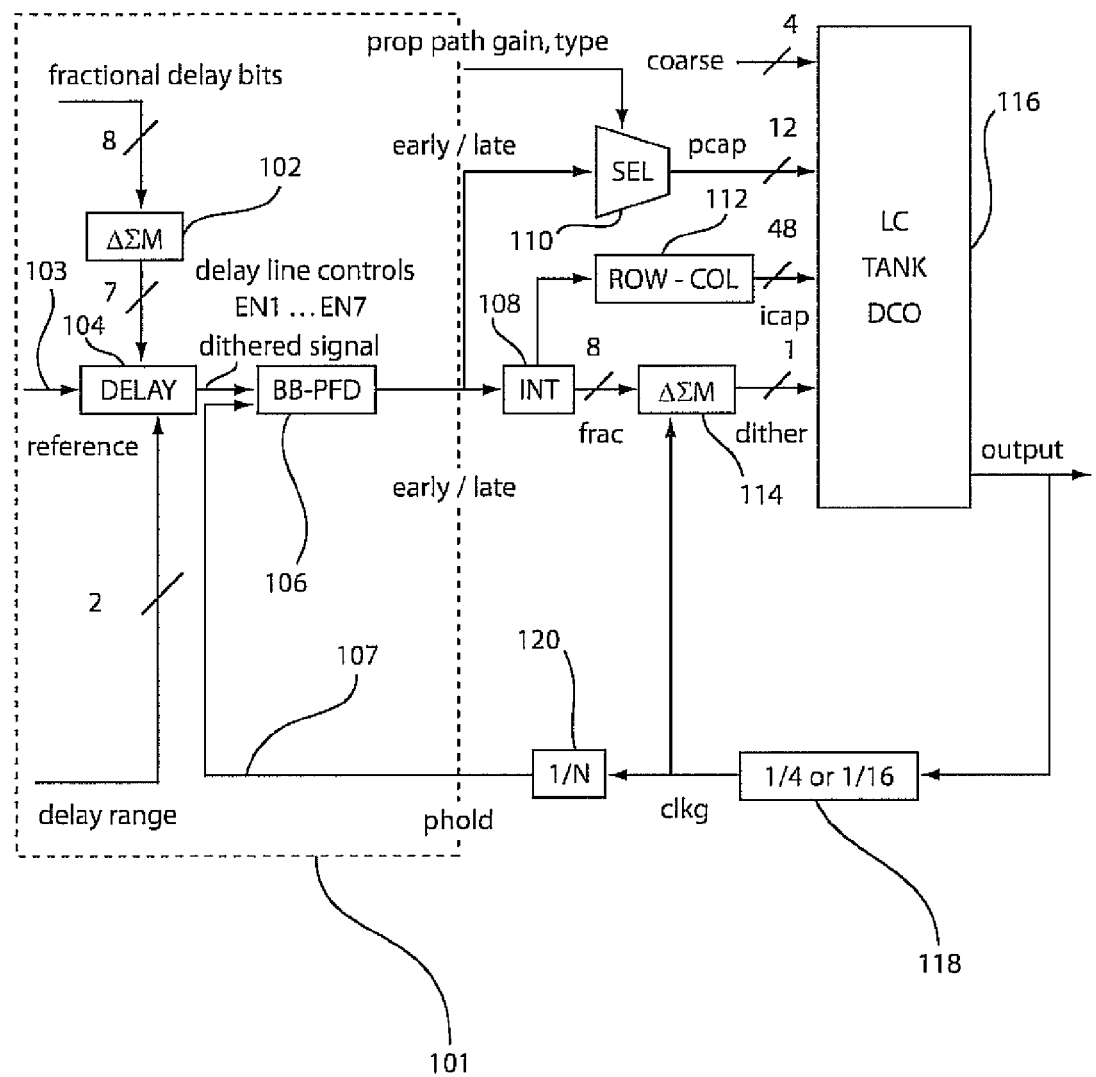
FIG. 4 is a schematic diagram showing a Digital PLL with reference dithering in accordance with one illustrative embodiment.

Referring to FIG. 4, a top level block diagram of the design realizing a BB-PFD DPLL architecture 100 is illustratively shown in accordance with the present principles. A BB-PFD 106 compares edges of an input reference clock (reference) and a feedback clock (phold), and provides 1-bit early-late data both to a low latency proportional path and to an integral path. The gain of the proportional path is set in a programmable selector 110 (SEL), which passes the PFD output directly to the pcap input ports of a digitally controlled oscillator (DCO) 116. The integral path is formed by applying a weighted PFD output to an accumulator 108 (INT) (e.g., (a 24-bit accumulator)). The overflow-underflow (inc/dec) signals from the accumulator 114 are further integrated in a row-column control block 112 (ROW-COL), which drives the array of 48 icap varactors. The 8 most significant bits (frac) of the internal state of the accumulator 108 are also applied to the DCO 116 via a dither output of a $1^{st}$-order delta-sigma modulator 114 ($\Delta\Sigma$M); the remaining 16 bits are discarded. The DPLL 100 output is prescaled (by 4 or by 16) using a scaler 118 to generate the global internal clock, clkg, which is then further divided in an 8-bit programmable divider 120 (1/N).

In a linear model, the gain of the BB-PFD 106 is inversely proportional to the rms jitter on the reference clock (reference). It is possible, therefore, to vary the PFD gain and the overall DPLL bandwidth by adding a controlled amount of jitter to the reference signal. In this architecture, this is achieved by inserting a digitally controlled delay line 104 (DELAY), in the reference clock path. Delay line controls include a delay bits generator (not shown) that outputs fractional delay bits and a $\Delta\Sigma$ modulator 102 to provide delay line enable signals (EN). To avoid degrading PLL in-band noise, the additional jitter is $\Delta\Sigma$-shaped to frequencies much higher than the PLL bandwidth.

Advantageously, a controlled amount of jitter can be added to the PLL reference input 103, a feedback clock or loop 107 (phold) or both enabling the designer to achieve low values of $K_{PFD}$ and keep the PLL bandwidth near a target value. Note that σ, the r.m.s. of the added jitter, is preferably to be much higher than either the reference or feedback jitter, therefore making the design largely insensitive to the variations of the reference jitter. The jitter, however, should be added in such a way as to not to affect the PLL in-band noise performance. Another advantage of the present principles is the shaping of the added jitter, so that all additional noise power is moved to high frequencies, much higher than the PLL bandwidth. The additional high-frequency noise will then be naturally filtered out by the low-pass PLL transfer function, while the in-band reference noise will not be affected. This achieves both the goal of controlling the PFD gain and the goal of improving the PLL phase noise performance.

The original reference signal (reference) goes through the delay block 104 before being applied to the BB-PFD 106. The delay block 104 has 2 sets of controls. One is a static setting of the value of the delay, "delay range", scaling the overall jitter up or down, as needed. Another, "delay line controls", is a dynamic output of the Delta-Sigma modulator $\Sigma\Delta$M 102, for time-domain modulation of the jitter and shaping it to higher frequencies. It should be understood that $\Sigma\Delta$M 102 may be replaced by a suitable modulator capable of setting delay line controls (EN1-EN7) in accordance with the present principles. Further, the fractional data bits input to $\Sigma\Delta$M 102 may be provided in a plurality of ways. In one embodiment, the fractional data bits are based feedback from the output of the DCO 116. In another embodiment, the fractional data bits are based on feedback from the BB-PFD 106. In yet another embodiment, the fractional data bits are based on feedback from both the BB-PFD 106 and the DCO 116. Contributions from these and other circuits may be employed to achieve a linearized output from the BB-PFD 106 and/or a shifting of jitter response to higher frequencies (e.g., above the operating frequencies of the PLL).

Figure 5:
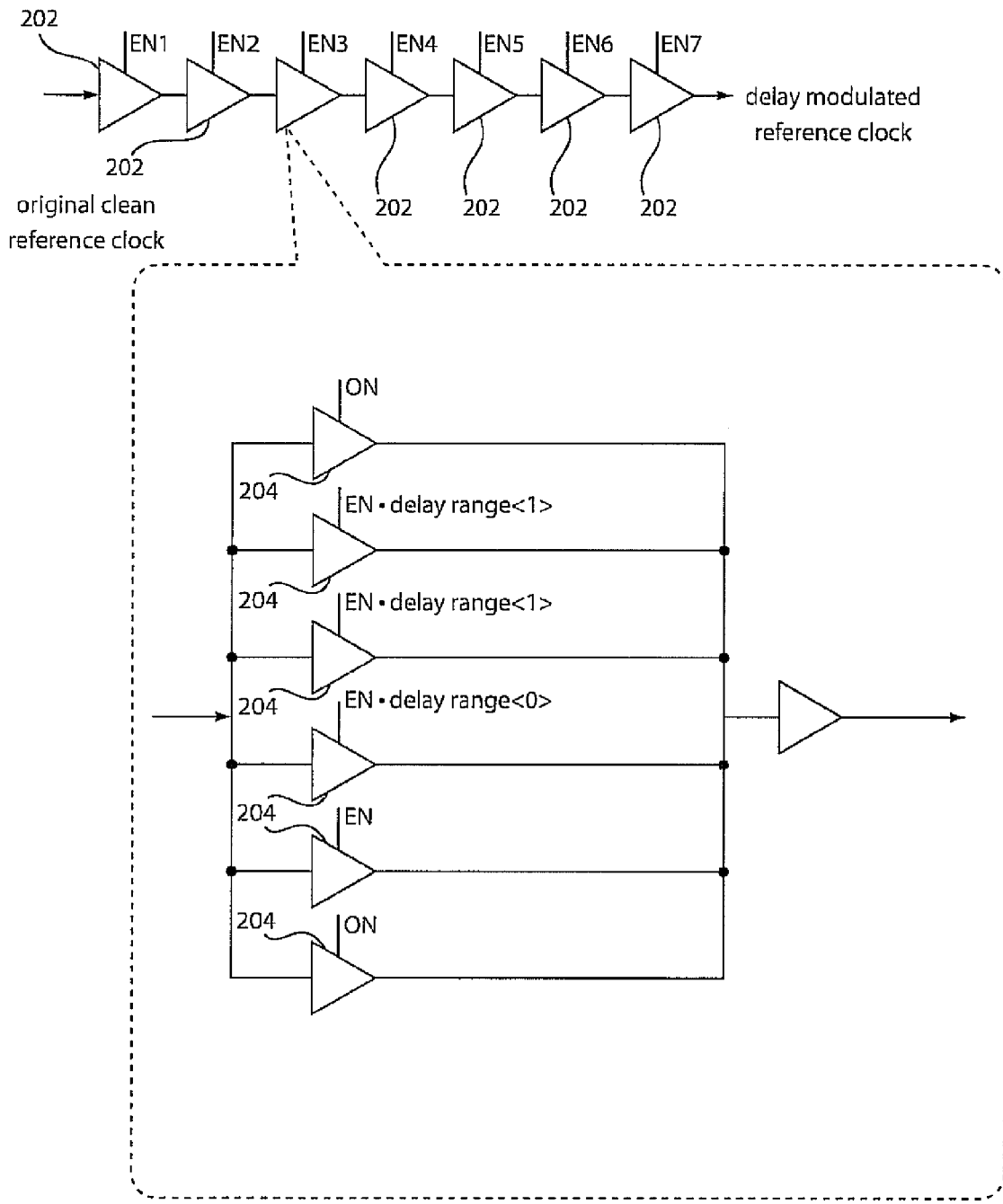
FIG. 5 is a schematic diagram showing a digitally controlled reference delay circuit in accordance with one illustrative embodiment.

Referring to FIG. 5, an illustrative implementation of the delay block 104 is shown. In this example, seven stages 202 enable $3^{rd}$ order Delta-Sigma modulation. Each of the stages 202 includes tri-state buffers 204 with dotted inputs and outputs. The EN signal modulates the delay of the cell by activating 1, 2 or 4 of the buffers 204 in the cell, depending on the delay range setting. Each of the stages or blocks 202 has four settings 204 (designated by a connection of EN) for the delay value depending on the "delay range" bits. The numerical values of the delay values per stage 202 may be in the ps range, e.g., from 2 ps to 10 ps. These are of course much higher than reference noise value, which is well under 1 ps.

Each of the 7 major elements 202 in the figure may have a slow path dotted with a fast path, and 2 bits of control that determine the relative strength of each element 202. The 7 elements 202 are used to support 3rd order sigma-delta operation (only 3 elements would be needed for 2nd order operation, and 1 for first order operation).

Figure 6:
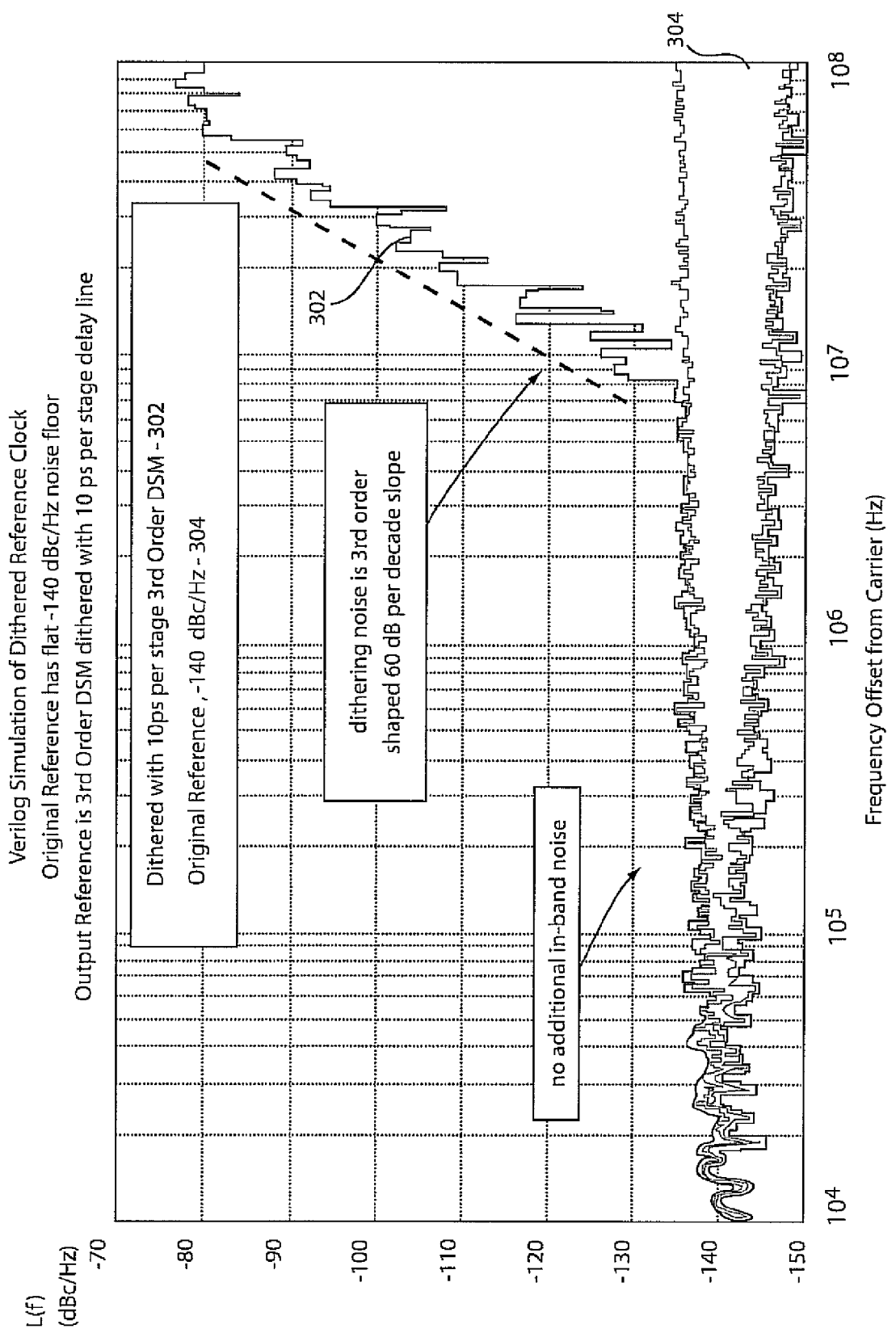
FIG. 6 is a plot of phase noise (L(f)) versus frequency offset from a carrier showing phase noise responses between an original reference and a dithered reference clock signal in accordance with the preset principles.

Referring to FIG. 6, simulated phase noise of the dithered reference is shown. A property of the dithered reference 302 is that it tracks the original clean reference 304 almost exactly at offset frequencies under 10 MHz. This ensures that the in-band PLL performance is not going to be affected by dithering. The PFD gain $$\left(K_{PFD} = \frac{1}{\sqrt{2\pi}}\frac{1}{\sigma}\right)$$

is determined by the total added noise, given by the integral under the phase noise plots. Clearly, the total noise of the dithered reference is much larger than that of the original reference (it climbs ~60 dB between 10 MHz and 100 MHz), enabling the achievement of the desired low values of the PFD gain and of the PLL bandwidth (on the order of several MHz or less). The additional noise added in the dithered (or modulated) case is shaped to higher frequencies and thus can be readily filtered by the PLL's natural transfer characteristic.

Figure 7:
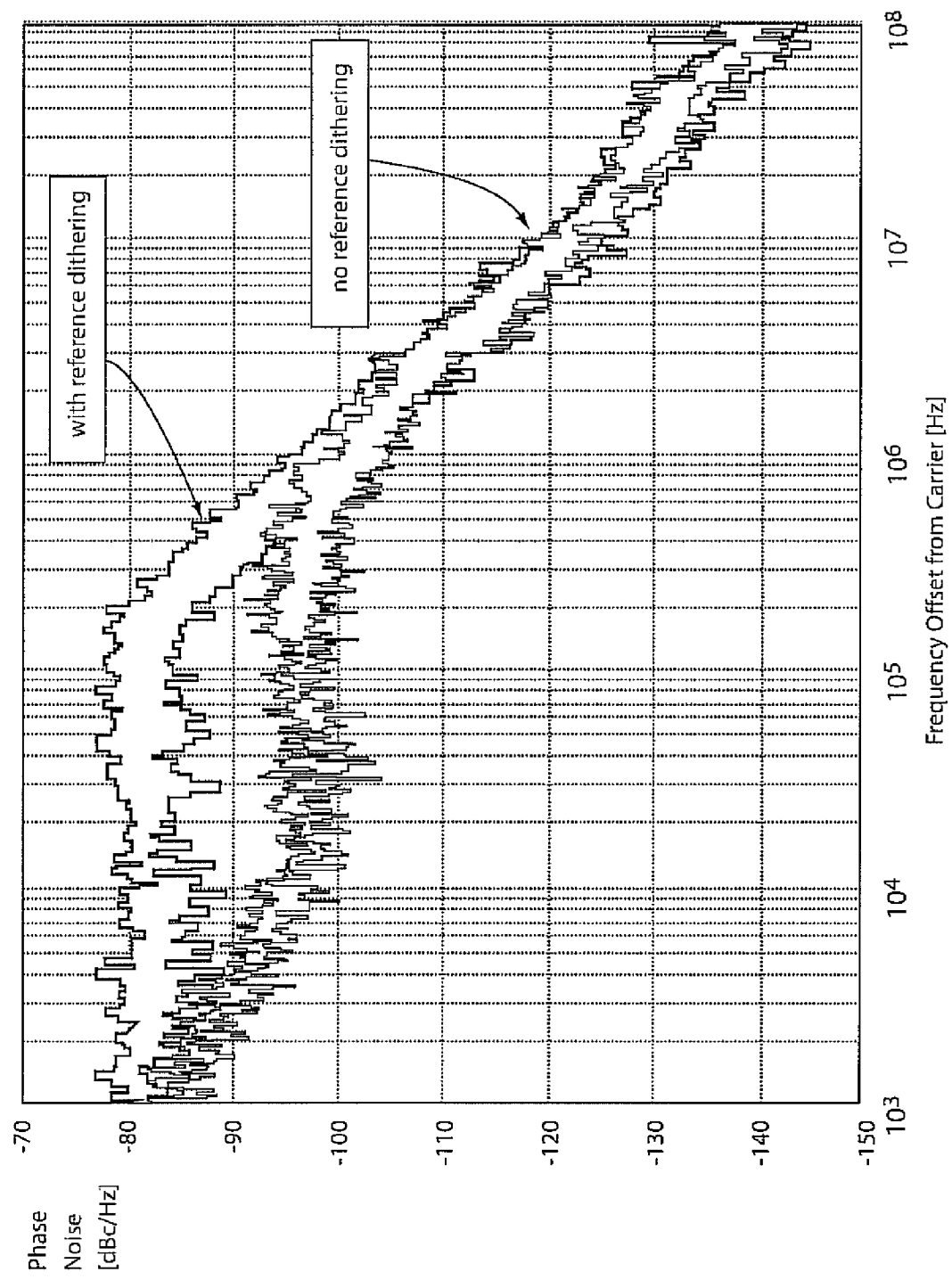
FIG. 7 is a plot showing measured phase noise of a PLL with and without reference dithering.

Referring to FIG. 7, a measured phase noise performance of a PLL in accordance with the present principles shows the PLL bandwidth control without the introduction of additional high frequency noise. In fact, the measured (integrated from $\frac{1}{1667}$ to $\frac{1}{2}$ of the carrier frequency) r.m.s. jitter of the PLL output is better in the case with reference dithering, especially at lower frequencies as desired.

Figure 8:
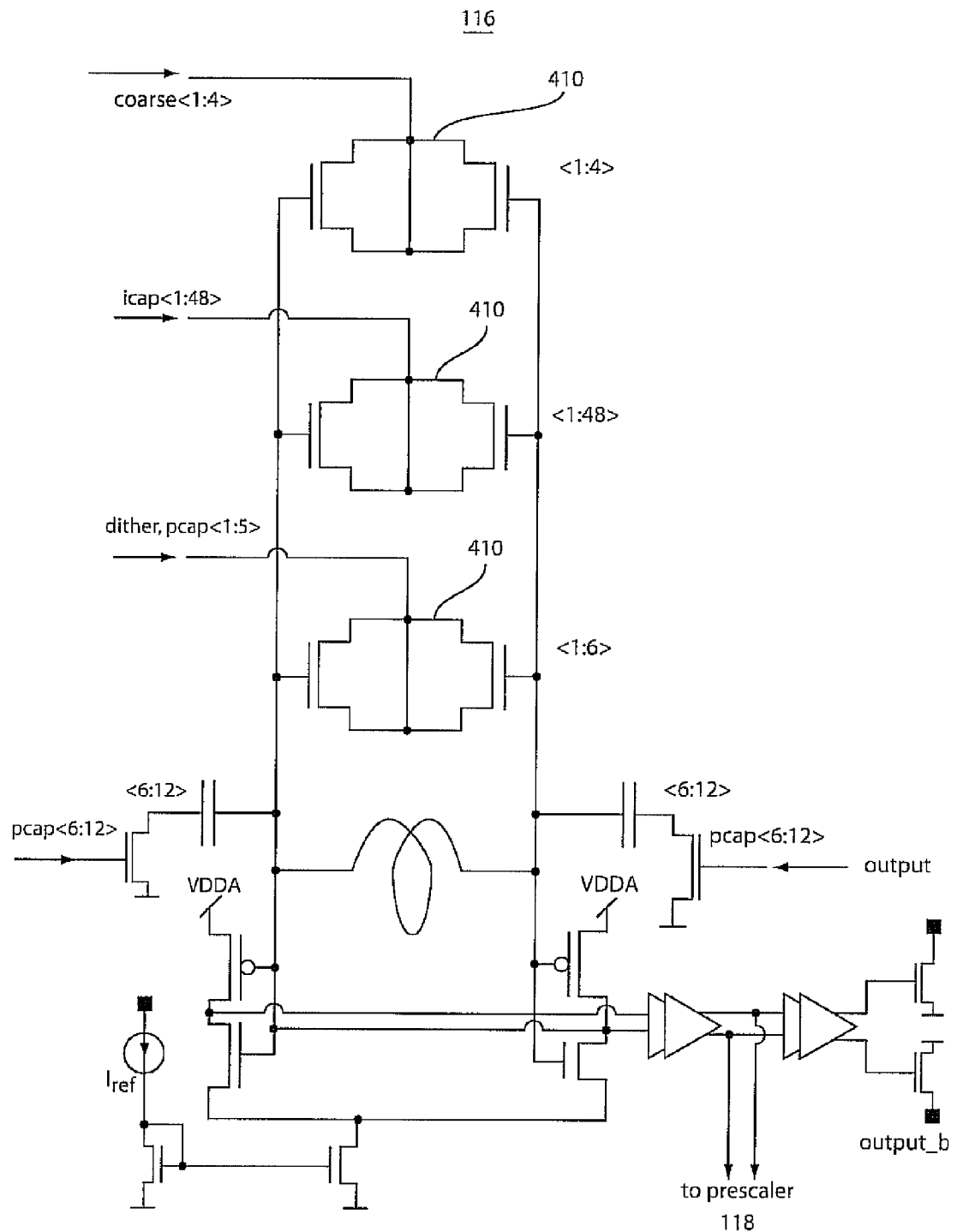
FIG. 8 is a schematic diagram of an illustrative digitally controlled oscillator in accordance with one embodiment.

Referring to FIG. 8 with continued reference to FIG. 4, the LC-DCO 116 is illustratively shown for one exemplary embodiment and has 4 binary weighted and 48 thermometer coded nFETs in nwell accumulation-mode varactors 410 for coarse (coarse) and fine (icap) tuning, respectively. The icap- and dither-controlled (dither) varactors are all equally sized. Note that the wide tuning range requirement of the target application severely limits the number of realizable fine steps due to the additional static capacitance associated with each varactor 410. This, in turn, results in a wide separation between fine steps and thus significant DCO quantization noise. To alleviate this problem, a second DCO dithering mechanism has been introduced. The row-column control block 112 internally addresses a 96-step array. This permits the DCO 116 to be configured as having either 48 or 96 steps, with the extra 48 steps created dynamically by dithering between adjacent fine steps at the clkg rate. In this mode, the dither signal is gated by clkg to scale the DCO ΔΣM gain to match the halved separation between DCO steps. If the dynamic DCO levels are not enabled, the integrator 108 simply overflows/underflows twice to produce a change in the DCO's icap input.

Two different types of low gain proportional path control are implemented in the DCO 116. In the first type, the desired small change in tank capacitance is achieved by applying complementary early/late signals to 2 varactors of slightly different sizes via inputs pcap<1:5>. In the second type, it is achieved by grounding or floating one of the plates in a parasitic metal to metal capacitance via inputs pcap<6:12>.

Figure 9:
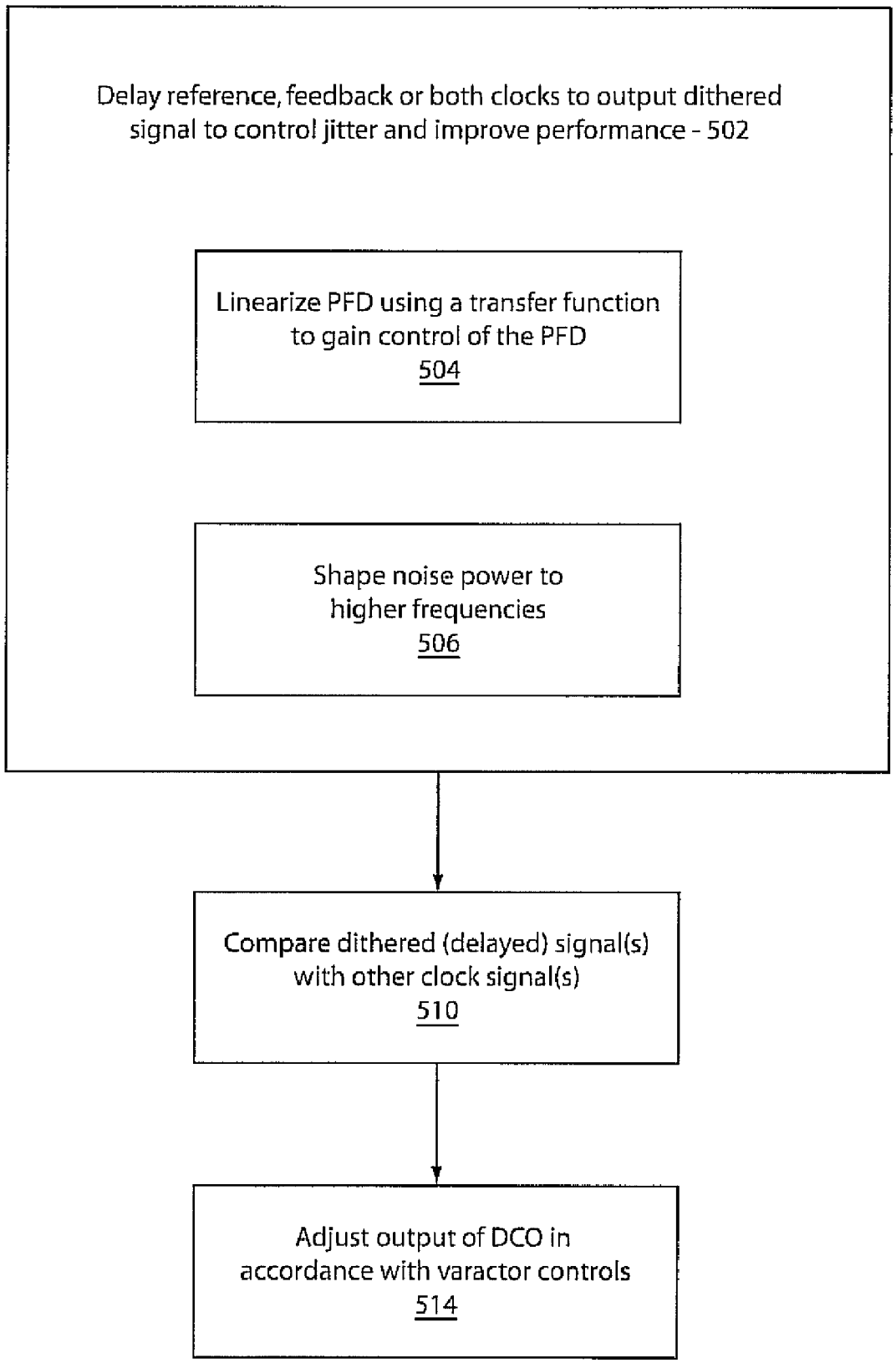
FIG. 9 is a block/flow diagram showing a system/method for controlling jitter in a PLL circuit in accordance with one illustrative embodiment.

Referring to FIG. 9, a method for controlling jitter in a digital phase locked loop (DPLL) is illustratively depicted. In block 502, delay in a delay line configured to receive one of a reference clock or a feedback clock or both as an input. Delay is adjusted to output a dithered signal. In block 504, adjusting delay includes linearizing the PFD response using a transfer function by the use of the delay line to modulate behavior of the clock input (reference, feedback or both). The transfer function enables control of gain of the PFD. In block 506, adjusting delay includes adjusting the gain such that noise power is shaped to higher frequencies beyond a loop bandwidth of the DPLL. Adjusting delay includes injecting jitter into the DPLL to make the behavior of the DPLL more controllable and predictable, and, at the same time, improve jitter performance of the DPLL in frequency bands of interest.

In block 510, the dithered signal or signals are compared. For example, a dithered reference clock signal can be compared with a feedback clock signal using a phase and frequency detector (PFD) configured to determine phase and frequency differences between the dithered reference clock signal and the feedback clock signal. The feedback clock signal could also be dithered instead of or in addition to the reference clock signal. In block 514, an output of a digitally controlled oscillator (DCO) is adjusted in accordance with early or late determinations from the PFD, wherein delaying the reference clock to provide the dithered reference clock signal distributes jitter response to enhance overall operation of the DPLL. A row-column control block is configured to drive varactors of the DCO such that the DCO is configured as having extra steps created dynamically by dithering between adjacent fine steps to scale DCO gain to match separation between DCO steps.

In another embodiment which may be implemented together with or separately from the delay line 104 for the PFD 106, a DCO (600 or 700) may be employed to further control jitter and noise. The dithering method in accordance with the present principles employs fundamental properties of a digitally controlled oscillator. Frequency resolution of the oscillator is increased with no additional jitter and phase noise or the absolute minimum additional jitter and phase noise. Unlike conventional quantizers, the DCO is an integrator. The DCO phase is a time integral of the frequency. If the frequency changes in time ($\omega(t)$) so that the total integral over the oscillation period (T) stays the same, then no additional period jitter appears at the output as the result of DCO dithering:

$$\varphi(T) - \varphi(0) = \int_0^T \omega(t)dt. \quad (4)$$

The period of oscillation T can be found from Eq. (5):

$$2\pi = \int_0^T \omega(t)dt. \quad (5)$$

In DCO dithering schemes, running at ¼ or ⅛ of the DCO frequency, the integrand in Eq. (5) stays constant at one value for 4 (or 8) clock cycles and then jumps to a different value for the next 4 (or 8) cycles. As a result, the DCO produces 4 (8) clock cycles with period 1/f and then another 4 (8) with period 1/(f+Δf). Clearly, this results in period jitter. As described, the value of that jitter is approximately $\Delta f/f^2$.

In accordance with particularly useful embodiments, dithering of the DCO is performed at a much higher rate, particularly, equal to or a multiple of its operating frequency, so that the integral in Eqs. (4) and (5) remains constant. In this case, the DCO period (T) is the same for all cycles and no additional jitter is generated by this dithering scheme.

Figure 10A:
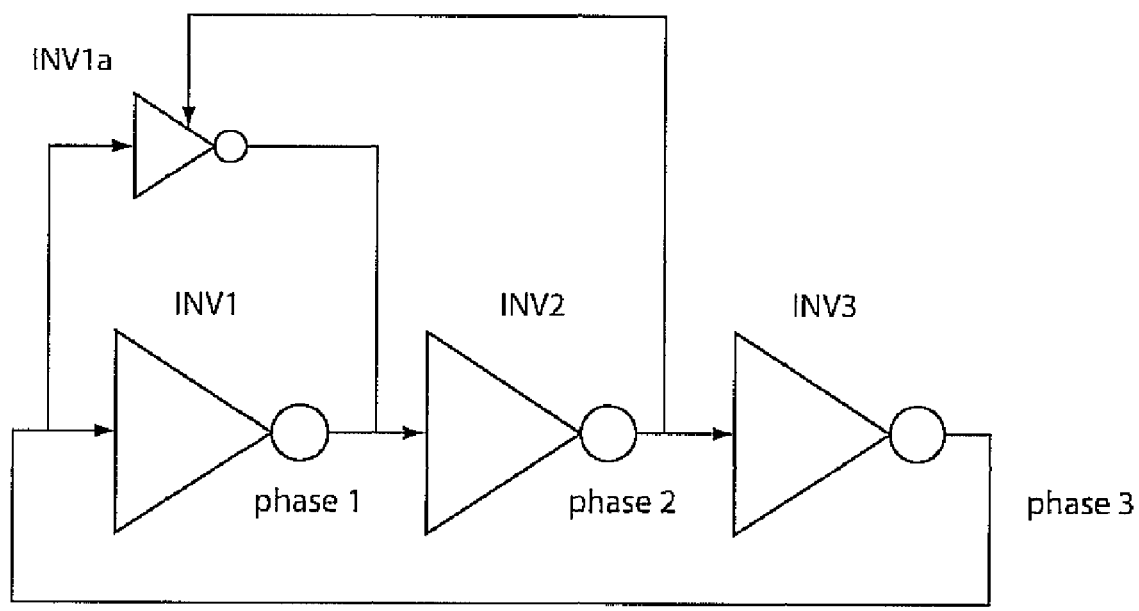
FIG. 10A is a schematic diagram showing a self-dithering ring DCO in accordance with one illustrative embodiment.

Referring to FIG. 10A, a self-dithering 3-stage ring-DCO 600 schematic is shown in accordance with one illustrative embodiment. The DCO 600 is depicted as 3 equally sized large inverters INV1, INV2 and INV3. These inverters (INV1, INV2 and INV3) drive DCO nodes marked as phase 1, phase 2 and phase 3.

Figure 10B:
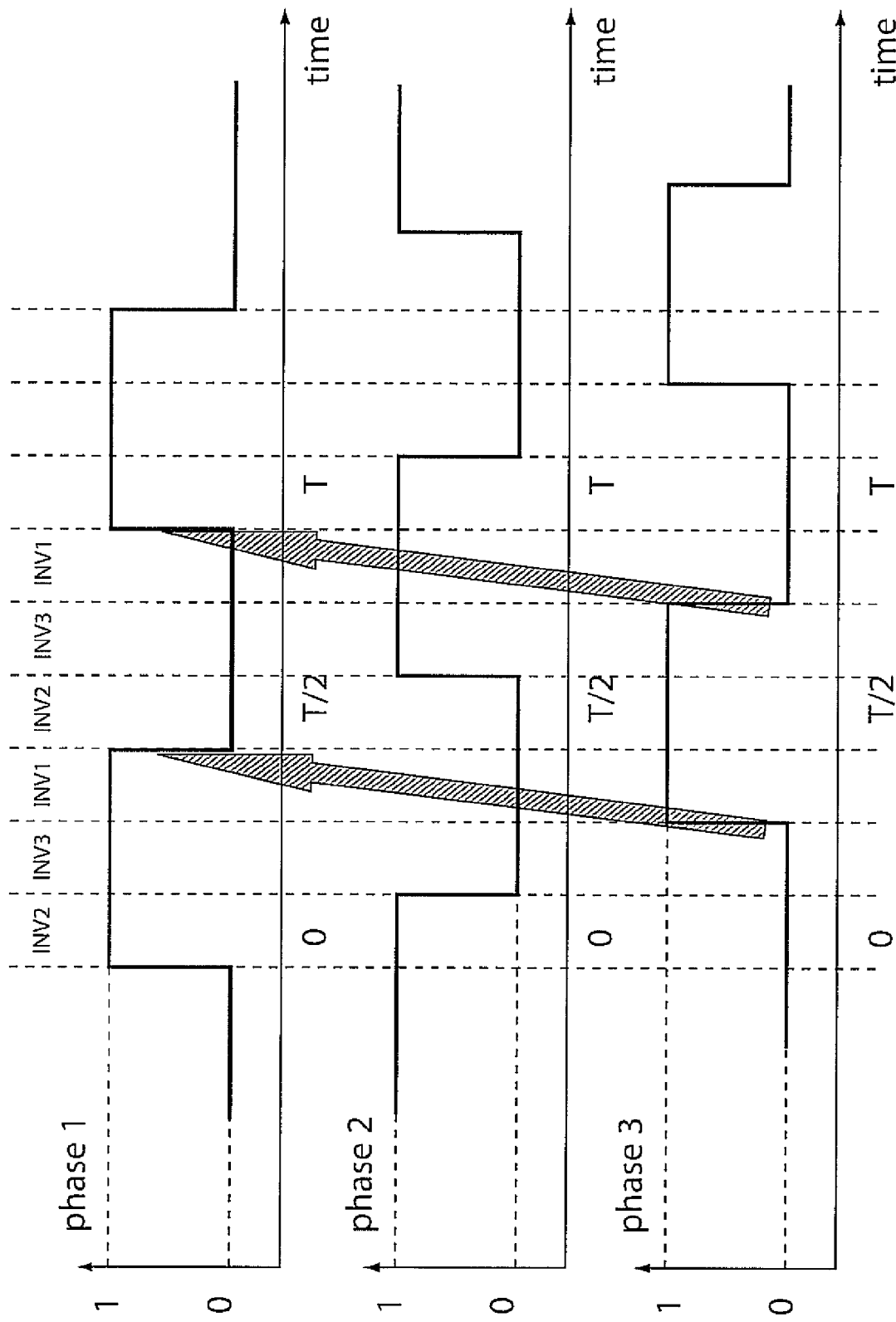
FIG. 10B is a timing diagram showing phase waveforms for the ring DCO of FIG. 10A when a dithering inverter is off in accordance with the present principles.
Figure 10C:
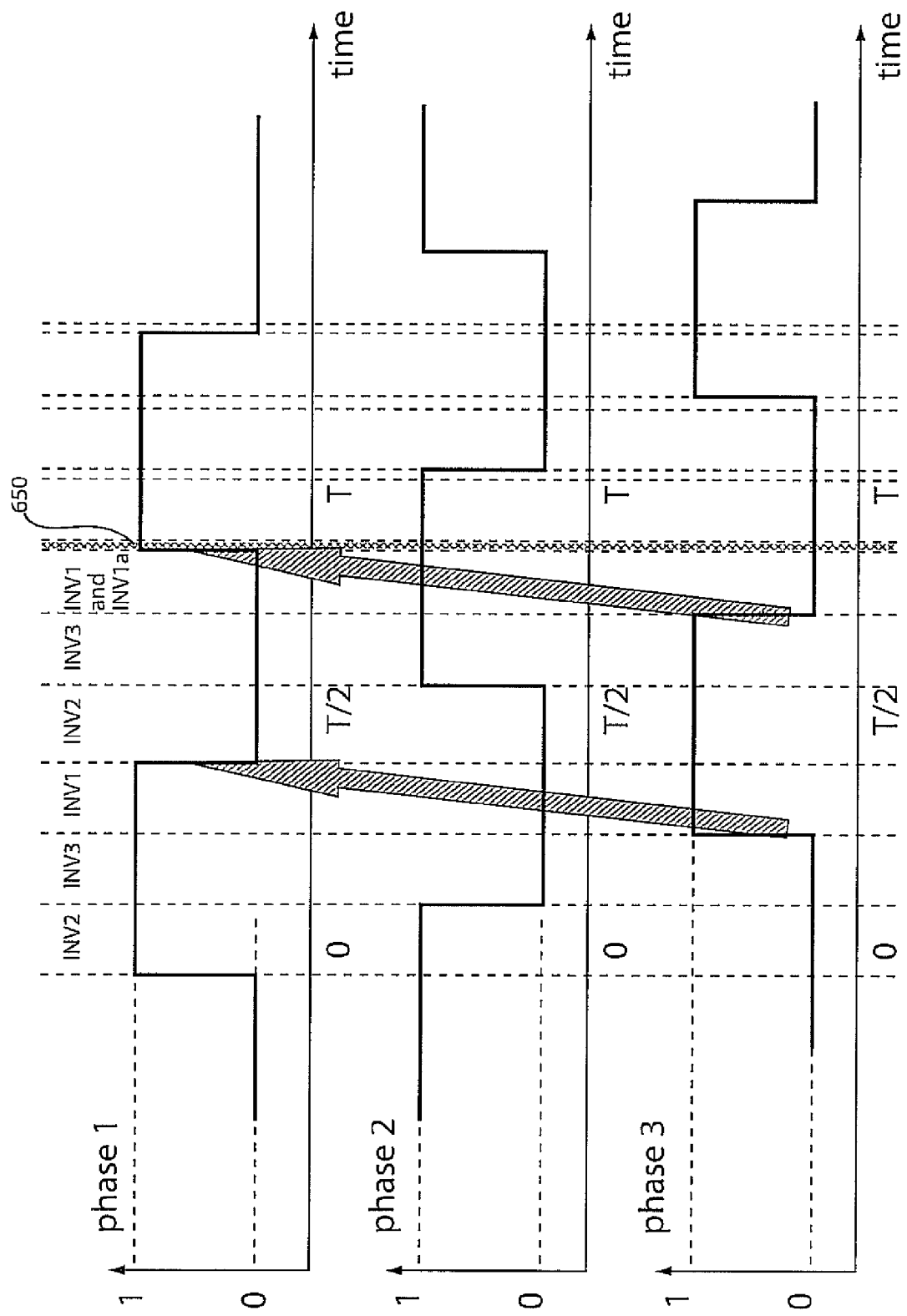
FIG. 10C is another timing diagram showing phase waveforms for the ring DCO of FIG. 10A when a dithering inverter is on in accordance with the present principles.

Normal 3-stage ring-DCO waveforms are shown in FIG. 10B. Note that the total delay of the oscillation is the sum of the delays through inverters INV1, INV2 and INV3 times 2, for raising and falling transitions. A smaller dithering inverter INV1a is a tri-state inverter controlled by phase 2. When phase 2 is low, the tri-state inverter INV1a is off (FIG. 10B), when the phase 2 is high, the tri-state inverter INV1a is on (FIG. 10C). As a result, a combined driving strength 650 of the inverter INV1 and INV1a is modulated as a function of phase 2. The resulting waveform is shown in FIG. 10C. (The low-to-high transition from phase 3 to phase 1 results in a smaller delay).

Note, that unlike the situation in FIG. 10B, the rising and falling transitions from phase 3 to phase 1 (shown in large arrows) in FIG. 10C take a different amount of time. The delay through stage 1 of the DCO (INV1 with INV1a) is therefore different for the low and high clock-half cycles. The 0-to-T/2 time interval in the phase 1 waveform is unchanged, while the T/2-to-T delay is slightly shorter, due to the added driving force of the smaller inverter INV1a, enabled by the phase 2 signal, which is high during this transition. In this example, the DCO runs at f+Δf for half of the oscillation period and at f for the other half.

The DCO oscillation period T stays constant at a value corresponding to approximately f+Δf/2. Advantageously, we have achieved a frequency between the DCO quantization points, without adding any period jitter! The trade-off in this full-rate dithering may be a non-50% duty cycle of a generated clock. However, at values of f and Δf the resulting change in duty cycle is negligibly small, e.g., about 0.5% at f=4 GHz and Δf=10 MHz. Note, that if the DCO is dithered at 2f or higher multiples, the duty cycle is preserved at 50%. Additionally, the DCO can be run at 2× the desired frequency and then divided by 2. The divided output would then have a perfect 50% duty cycle.

There is a relationship between oscillator (open-loop or inside PLL) phase noise and period jitter.

$$\sigma_T^2 = \int_0^{+\infty} S_\phi(\omega) 4\sin^2\left(\frac{\omega T}{2}\right) d\omega. \quad (6)$$

Eq. 4 above can be equivalently stated as:

$$S_\phi(\omega) = \frac{S_\Omega(\omega)}{\omega^2}. \quad (7)$$

As a result, we arrive at the following relation between oscillator period jitter and spectral distribution of the oscillator frequency:

$$\sigma_T^2 = \int_0^{+\infty} \frac{S_\Omega(\omega)}{\omega^2} 4\sin^2\left(\frac{\omega T}{2}\right) d\omega. \quad (8)$$

Here, $\sigma$ is the standard variance of the oscillator period jitter, $\omega$ is angular velocity, $S_\Phi$ is the phase noise spectrum and $S_\Omega$ is the corresponding frequency noise spectrum (or, equivalently, power spectral density of the oscillator frequency).

The resulting Eq. 8 establishes the relation between the power spectral density of the oscillator frequency and the period jitter. Eq. 8 is valid for free-running oscillators and for oscillators inside the PLL, it also includes effects of random fluctuations of frequency due to thermal noise and other noise sources. The integrand in Eq. 8 has zeros at frequencies equal to 1/T and integer multiples thereof. The effects of dithering on the period jitter can be minimized or completely eliminated if additional spectral energy due to DCO dithering is placed at or near these zeros.

The present approach is to actively shape the spectral density $S_\Omega(\omega)$ of the oscillator frequency distribution so that the dithering energy falls at or near the zeros in the integrand in Eq. 8. In practice, placing the dithering spectral energy at or near 2f, 3f and higher frequencies could be difficult, but not impossible. Dithering at frequencies close to f can be more easily implemented. In particular, the example dithering scheme shown in FIG. 10A is representative of a more general class "self-dithering" DCOs, where the output signal is fed back to dither the DCO between the frequencies of f and f+Δf, resulting in an output frequency of approximately f+Δf/2 without any additional jitter. A more exact equation for the resulting frequency is given by 0.5/((1/f)+1/(f+Δf)), reflecting the fact that one half-period is unchanged.

Figure 11:
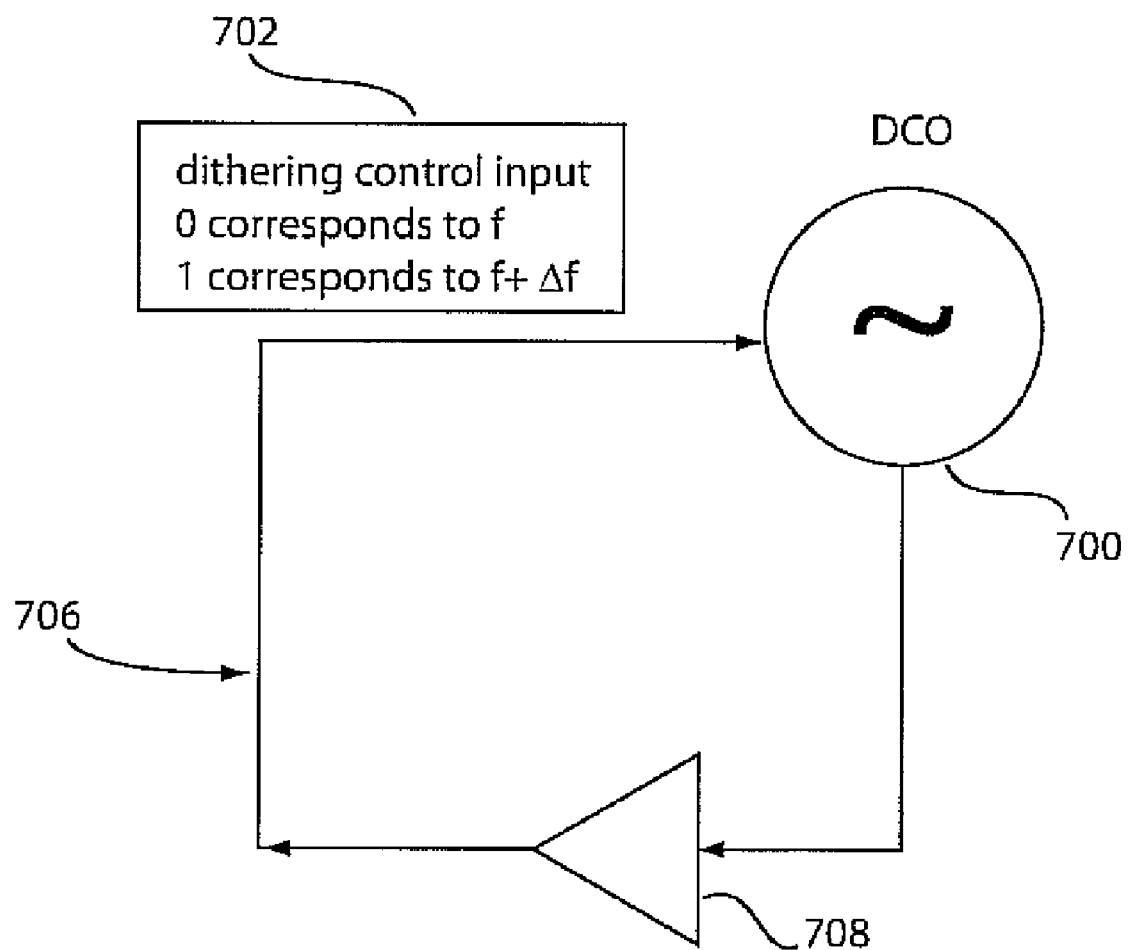
FIG. 11 is a diagram showing a dithering control input for a self-dithering DCO in accordance with the present principles.

The above principles can be applied to both LC-based DCO and a ring-oscillator based DCO. Referring to FIG. 11, a general self-dithering DCO 700 is shown in accordance with an illustrative implementation. It should be understood that the DCO 700 may be employed as the DCO in FIG. 4. A dithering control 702 input receives a feedback control bit (1 or 0) through a feedback loop 706. An output signal 704 is fed back to dither DCO 700 between the frequencies of f and f+Δf, achieving Δf/2 dither without any additional jitter. In this example, a feedback signal of 0 corresponds with f and 1 corresponds with f+Δf. During an oscillation cycle, the frequency of f is preferably maintained for half the cycle and f+Δf is maintained for the other half. In general, the present optimal dithering approach offers a trade-off between shaping the $S_\Omega(\omega)$ and achieving minimum desired period jitter. An optional gain block 702 may be provide in the feedback path 706.

A DCO without dithering has many discrete frequencies. In accordance with the present principles, we select a frequency and call it "f", the next higher frequency is called "f+Δf", where "Δf" is the separation between these two neighboring DCO frequency steps. The desired output is in general somewhere between those two frequencies. The "self-dithering" examples in FIGS. 10A-10C and FIG. 11 advantageously demonstrate how an intermediate frequency of approximately f+Δf/2 can be achieved without adding any period jitter.

Figure 12:
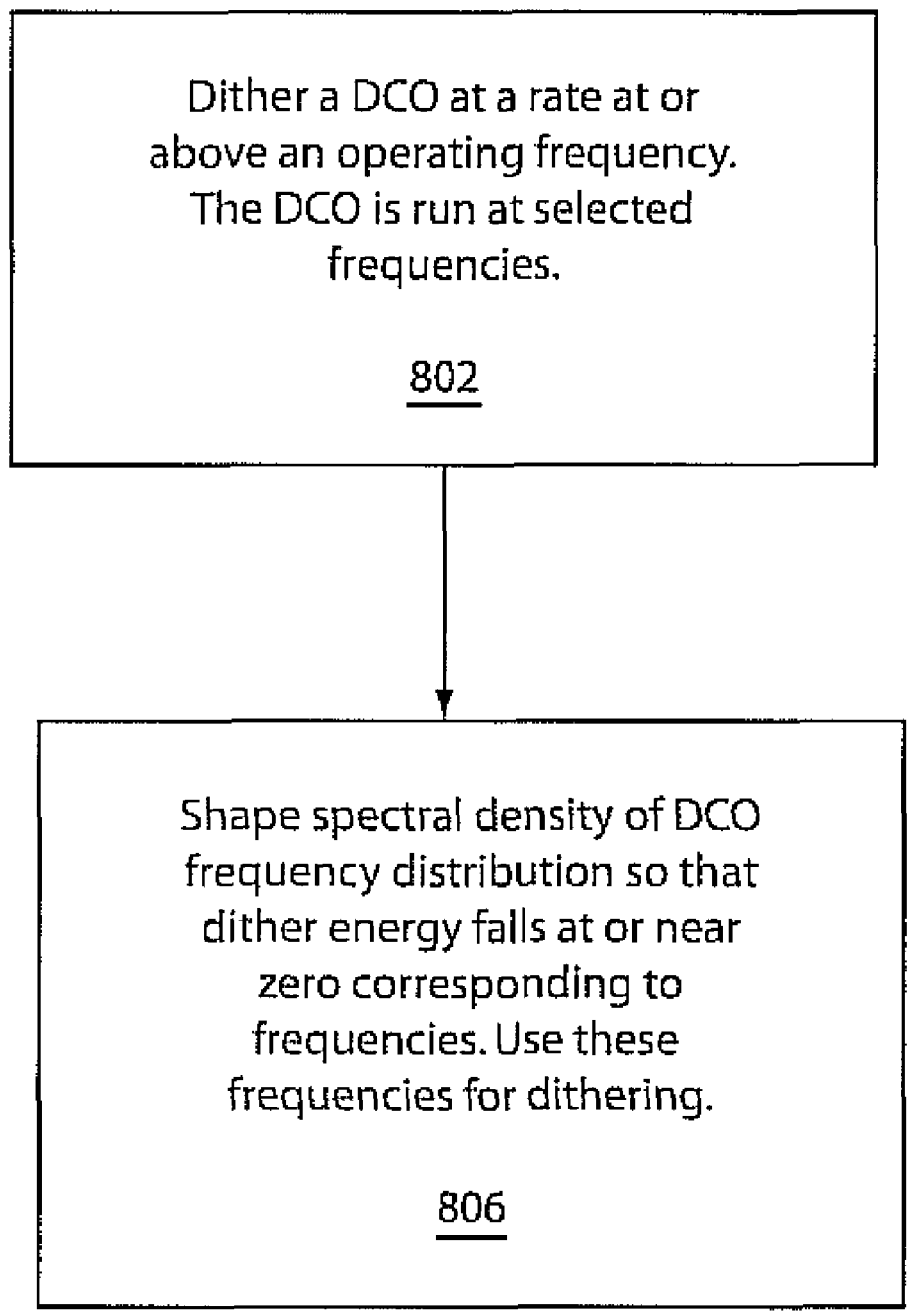
FIG. 12 is a block/diagram showing a system/method for optimal dithering in accordance with the present principles.

Referring to FIG. 12, a block/flow diagram for optimizing dither in a digitally controlled oscillator (DCO) is illustratively shown. In block 802, a DCO is dithered at a rate equal to or exceeding its operating frequency (f). Dithering includes running the DCO at f+Δf for one half of an oscillation period and at f for another half of the oscillation period. The dithering is controlled for the DCO between frequencies of f and f+Δf during an oscillation cycle to achieve Δf/2 during the cycle without adding jitter. The frequencies may include integral multiples of the frequencies of f and f+Δf. The oscillation period (T) accordingly remains constant at a value corresponding to approximately f+Δf/2.

In block 806, a spectral density of an oscillator frequency distribution is actively shaped so that dithering energy falls at or near zero such that no additional jitter or phase noise is introduced in the dithering. The spectral density is given by Eq. (8) although other equations may be employed. The active shaping includes determining frequencies to reduce an integrand of Eq. (8) to zero or substantially zero. The dithering is performed at or near these frequencies.

Having described preferred embodiments for optimal dithering of a digitally controlled oscillator with clock dithering for gain and bandwidth control (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A digital phase locked loop (DPLL), comprising:
an adjustable delay line configured to receive at least one of a reference clock and a feedback clock as an input and to output a dithered signal;
a phase and frequency detector (PFD) configured to compare clock signals including a reference clock signal and a feedback clock signal wherein at least one of the clock signals is the dithered signal to determine phase and frequency differences between the clock signals, and further wherein a gain of the PFD is adjusted such that noise power is shaped to higher frequencies beyond a loop bandwidth of the DPLL; and
a digitally controlled oscillator (DCO) configured to receive early or late determinations from the PFD to adjust an output in accordance therewith, wherein the dithered signal distributes jitter response to enhance overall operation of the DPLL.

2. The DPLL as recited in claim 1, wherein the PFD includes a transfer function that is linearized by the use of the adjustable delay line to modulate behavior of a clock input.

3. The DPLL as recited in claim 2, wherein the transfer function enables control of gain of the PFD.

4. The DPLL as recited in claim 1, wherein the jitter is injected into the DPLL to make the behavior of the DPLL more controllable and predictable, and, at the same time, improve jitter performance of the DPLL in frequency bands of interest.

5. The DPLL as recited in claim 1, wherein the adjustable delay line includes a plurality of stages controlled using delay line controls derived by feedback from at least one of the DCO and the PFD.

6. The DPLL as recited in claim 1, wherein the stages each include a plurality of buffers wherein the buffers are activated in accordance with a delay range signal.

7. The DPLL as recited in claim 1, further comprising a row-column control block configured to drive varactors of the DCO such that the DCO is configured as having extra steps created dynamically by dithering between adjacent fine steps to scale DCO gain to match separation between DCO steps.

8. The DPLL as recited in claim 1, further comprising a dithering control circuit for changing an operating frequency to the DCO, the dithering control circuit including a feedback loop connected to an output to feed back a control sequence to enable a frequency of operation, wherein the DCO is thereby dithered at a rate equal to or exceeding its operating frequency and a spectral density of an oscillator frequency distribution is shaped so that dithering energy falls at or near zero so that no additional jitter or phase noise is introduced by the dithering.

9. A method for controlling jitter in a digital phase locked loop (DPLL), comprising:
adjusting delay in a delay line configured to receive at least one of a reference clock signal and a feedback clock signal as an input and to output a dithered signal;
comparing the reference clock signal with the feedback clock signal, wherein at least one of the reference clock signal and the feedback clock signal is dithered, by using a phase and frequency detector (PFD) configured to determine phase and frequency differences, and further wherein adjusting delay includes adjusting a gain of the PFD such that noise power is shaped to higher frequencies beyond a loop bandwidth of the DPLL; and
adjusting an output of a digitally controlled oscillator (DCO) in accordance with early or late determinations from the PFD, wherein the dithered signal distributes jitter response to enhance overall operation of the DPLL.

10. The method as recited in claim 9, wherein adjusting delay includes linearizing the PFD using a transfer function by the use of the delay line to modulate behavior of a clock input.

11. The method as recited in claim 10, wherein the transfer function enables control of gain of the PFD.

12. The method as recited in claim 9, wherein adjusting delay includes injecting jitter into the DPLL to make the behavior of the DPLL more controllable and predictable, and, at the same time, improve jitter performance of the DPLL in frequency bands of interest.

13. The method as recited in claim 12, wherein the adjustable delay line includes a plurality of stages and further comprising controlling the delay line using delay line controls derived by feedback from at least one of the DCO and the PFD.

14. The method as recited in claim 13, wherein the stages each include a plurality of buffers wherein the buffers are activated in accordance with a delay range signal.

15. The method as recited in claim 9, further comprising a row-column control block configured to drive varactors of the DCO such that the DCO is configured as having extra steps created dynamically by dithering between adjacent fine steps to scale DCO gain to match separation between DCO steps.

16. A method for optimizing dither in a digitally controlled oscillator (DCO), comprising:
dithering a DCO at a rate equal to or exceeding its operating frequency; and
actively shaping a spectral density of an oscillator frequency distribution so that dithering energy falls at or near zero such that no additional jitter or phase noise is introduced in the dithering.

17. The method as recited in claim 16, wherein the spectral density is given by $$\sigma_T^2 = \int_0^{+\infty} \frac{S_\Omega(\omega)}{\omega^2} 4\sin^2\left(\frac{\omega T}{2}\right) d\omega,$$

where $\sigma$ is standard variance of the oscillator period jitter, $\omega$ is angular velocity, $S_\Omega$ is a corresponding frequency noise spectrum (power spectral density of the oscillator frequency) and T is the oscillator period, and actively shaping includes determining frequencies to reduce an integrand to zero or substantially zero.

18. The method as recited in claim 16, wherein dithering includes running the DCO at $f+\Delta f$ for one half of an oscillation period and at f for another half of the oscillation period.

19. The method as recited in claim 18, wherein oscillation period remains constant at a value corresponding to approximately $f+\Delta f/2$.

20. The method as recited in claim 16, wherein dithering includes controlling the DCO between frequencies off and $f+\Delta f$ during an oscillation cycle to achieve $\Delta f/2$ during the cycle without additional jitter.

21. A self-dithered digitally controlled oscillator (DCO) circuit, comprising:
a DCO; and
a dithering control circuit for changing an operating frequency to the DCO, the dithering control circuit including a feedback loop connected to an output to feed back a control sequence to enable a frequency of operation, wherein the DCO is thereby dithered at a rate equal to or exceeding its operating frequency and a spectral density of an oscillator frequency distribution is shaped so that dithering energy falls at or near zero so that no additional jitter or phase noise is introduced by the dithering.

22. The DCO as recited in claim 21, wherein the spectral density is given by $$\sigma_T^2 = \int_0^{+\infty} \frac{S_\Omega(\omega)}{\omega^2} 4\sin^2\left(\frac{\omega T}{2}\right) d\omega,$$

where $\sigma$ is standard variance of the oscillator period jitter, $\omega$ is angular velocity, $S_\Omega$ is a corresponding frequency noise spectrum (power spectral density of the oscillator frequency) and T is the oscillator period, and actively shaping includes determining frequencies to reduce an integrand to zero or substantially zero.

23. The DCO as recited in claim 21, wherein the DCO is operated at one of: $f+\Delta f$ for one half of an oscillation period and at f for another half of the oscillation period and a constant value corresponding to approximately $f+\Delta f/2$.

* * * * *